(12) United States Patent
Helsen et al.

(10) Patent No.: US 11,632,124 B2
(45) Date of Patent: Apr. 18, 2023

(54) DEVICE AND METHOD FOR PROCESSING DIGITAL SIGNALS

(71) Applicant: Huawei Technologies Co., Ltd., Shenzhen (CN)

(72) Inventors: Mathias Helsen, Munich (DE); Koen Cornelissens, Leuven (BE); Alexandre Daubenfeld, Leuven (BE); Sofia Vatti, Leuven (BE); Marc Borremans, Leuven (BE); Johannes Samsom, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/531,457

(22) Filed: Nov. 19, 2021

(65) Prior Publication Data
US 2022/0077871 A1    Mar. 10, 2022

Related U.S. Application Data

(63) Continuation of application No. 16/932,354, filed on Jul. 17, 2020, now Pat. No. 11,196,439, which is a continuation of application No. PCT/EP2018/051225, filed on Jan. 18, 2018.

(51) Int. Cl.
*H03M 1/66*     (2006.01)
*G06N 5/046*    (2023.01)
*H03M 1/08*     (2006.01)

(52) U.S. Cl.
CPC .............. *H03M 1/66* (2013.01); *G06N 5/046* (2013.01); *H03M 1/0845* (2013.01)

(58) Field of Classification Search
CPC ....... H03M 1/66; H03M 1/0845; G06N 5/046

USPC ................ 341/126, 144, 161, 145, 146, 135
See application file for complete search history.

(56) References Cited

U.S. PATENT DOCUMENTS

| | | |
|---|---|---|
| 7,002,500 B2 | 2/2006 | Li |
| 7,489,261 B1 | 2/2009 | Kuttner |
| 9,813,071 B1 | 11/2017 | An et al. |
| 2005/0184896 A1 | 8/2005 | Li |
| 2009/0153380 A1 | 6/2009 | Soude et al. |
| 2013/0214953 A1 | 8/2013 | Shiraishi et al. |
| 2014/0253350 A1 | 9/2014 | Imai |
| 2015/0070074 A1 | 3/2015 | Dedic et al. |

(Continued)

FOREIGN PATENT DOCUMENTS

| | | |
|---|---|---|
| CN | 101436863 A | 5/2009 |
| CN | 202713277 U | 1/2013 |
| CN | 104917531 A | 9/2015 |

(Continued)

OTHER PUBLICATIONS

U.S. Appl. No. 16/932,354, filed Jul. 17, 2020.

*Primary Examiner* — Peguy Jean Pierre
(74) *Attorney, Agent, or Firm* — Leydig, Voit & Mayer, Ltd.

(57) ABSTRACT

A device for processing digital signals is provided. The device comprises a digital signal source and a converter circuit having a current supply. The digital signal source outputs a codeword. The converter circuit receives the codeword from the digital signal source, receives a current at the current supply, and generates an output signal based on the codeword. The current is generated in accordance with the codeword.

21 Claims, 7 Drawing Sheets

(56) References Cited

U.S. PATENT DOCUMENTS

2015/0207518 A1 7/2015 Liu et al.
2016/0373239 A1* 12/2016 Murali .................... H04B 1/40

FOREIGN PATENT DOCUMENTS

| JP | 2008219263 A | 9/2008 |
|----|--------------|--------|
| WO | 0227940 A2 | 4/2002 |
| WO | 2002027940 A2 | 4/2002 |
| WO | 2009079515 A1 | 6/2009 |

* cited by examiner

DEVICE AND METHOD FOR PROCESSING DIGITAL SIGNALS

CROSS-REFERENCE TO RELATED APPLICATIONS

This application is a continuation of U.S. patent application Ser. No. 16/932,354, filed Jul. 17, 2020, which is a continuation of International Application No. PCT/EP2018/051225, filed Jan. 18, 2018, All of the afore-mentioned patent applications are hereby incorporated by reference in their entireties.

TECHNICAL FIELD

The present disclosure relates to a device for processing digital signals and to a corresponding method. In particular, the device includes a digital signal source for providing digital signals, and a converter circuit for converting the digital signals. The present disclosure addresses specifically an issue of supply current variations of the device occurring when the converter circuit processes the digital signals.

BACKGROUND

A conventional device for processing digital signals suffers from current supply variations while processing the digital signals. The problem is in particular that the current requirements of the device, specifically of a converter circuit in the device, depend on codewords of the digital signal. That means a supply voltage (and supply current) of the converter circuit changes as the codewords change. These supply changes severely impact the performance of the conventional device.

As an example of such a converter circuit, a Digital-to-Analog Converter (DAC) is one of the most important building blocks of many conventional devices for digital signal processing. DACs are used in communication systems but also in any other place where an interface with the analog physical world is required.

A DAC consists typically of individual cells that contribute to its output signal. In particular, the number of cells that are enabled, together with their size(s), determines the output signal. Switching the cells ON and/or OFF draws current from the supply. Therefore, the current drawn by the DAC from the supply is a function of the analog output signal (and thus of the codeword of the digital input signal). In fact, the current consumption tracks the output signal. In combination with the finite impedance of the supply network, the supply voltage will also vary with the output signal. The variations in the supply voltage may specifically cause timing variations when the DAC cells switch, thereby causing harmonic distortion and a performance degradation.

Several solutions are possible for solving this issue. For example, the impedance of the supply could be lowered.

One solution would thereby be to reduce the output impedance of the voltage supply (typically a low-dropout regulator (LDO)). However, this has the drawback that the size of the LDO and/or the current consumption would increase significantly. This solution would accordingly increase the power consumption and also the production costs of the device.

Another solution would increase the speed of the voltage regulator, which would also come with a significant increase in power consumption.

Another solution would increase an on-chip decoupling capacitance. However, the required area for this capacitance would be very large, thus increasing production costs.

Another solution would add an off-chip decoupling capacitance. However, this would require an external component and a low impedance connection from the device to the external component, thus again increasing production costs.

A further solution would keep the consumption constant. For example, dummy DAC cells could be used, which do not contribute to the output signal, but have the same current consumption as the normal cells. Using such dummy cells, the total number of cells that are switched in the DAC may be kept constant. The major drawback, however, is the overall increased current consumption. That is, the DAC would always consume the current associated with a maximal output swing.

SUMMARY

None of the above-described solutions allow for over-compensating or pre-distorting the DAC. For a DAC, digital pre-distortion may be applied. However, this has the drawback that high current is required because of required digital calculations.

In view of the above-mentioned problems and disadvantages, the present disclosure provides for improvements to the conventional devices and methods for digital signal processing and avoidance of the drawbacks of the above-mentioned solutions.

More precisely, the present disclosure provides a device and method for digital signal processing with reduced supply variations. In particular, a converter circuit of the device does not show supply variations in dependence on a codeword of a digital signal to be converted. The device and method of the present disclosure also allow for over-compensating and/or pre-distorting the converter circuit. Additionally, the device and method of the present disclosure function independent of process, voltage and/or temperature changes (so called PVT variations).

The idea described in the present disclosure is to re-use digital information for a feed forward correction on the supply of the converter circuit. In other words, the present disclosure proposes to make use of the fact that the required current draw of the converter circuit is known to the device—or to a digital signal source controlling the converter circuit. This allows the device—or digital signal source—to instruct a feed forward circuit (also referred to as a Current Injection Bank (CIB)) to provide the current required to the converter circuit.

A first aspect provides a device for processing digital signals, comprising a digital signal source configured to output codewords, a converter circuit configured to generate an output signal based on a first codeword received from the digital signal source, and a feed forward circuit configured to generate an output current based on a second codeword received from the digital signal source, wherein the output current of the feed forward circuit is connected to a current supply of the converter circuit, and wherein the digital signal source is configured to generate the second codeword based on the first codeword to compensate variations of a supply current of the converter circuit.

The output current of the feed forward circuit is connected to the current supply of the converter circuit, in order to provide the required current for converting each first codeword provided by the digital signal source to the converter circuit. Thus, the device can correct—by generating a second codeword for each first codeword—for a time varying and codeword-dependent current consumption of the converter circuit. The device can thereby completely eliminate harmonic distortion due to supply ripple.

In addition, the device allows the supply voltage for the converter circuit to be varied based on the second codeword supplied to the feed forward circuit. This allows performing an analog pre-distortion by increasing or decreasing the supply voltage level, in order to further reduce spurs present in the device. The pre-distortion is thereby not limited to reducing spurs or artefacts arising from supply variations, but can also reduce other spurs present in the device, e.g. spurs caused by Local Oscillator (LO) leakage.

The device of the first aspect has several further advantages. For instance, the overall power consumption of the device does not increase much over a conventional device, since the converter circuit current is now supplied by the feed forward circuit instead of a voltage supply (such as an LDO). Furthermore, the demand placed on the feed forward circuit is relatively relaxed, which supports a reduction of the device area and of a power required by the device.

In an implementation form of the first aspect, the digital signal source is configured to generate the second codeword so as to reduce supply voltage variations to which the performance of the converter circuit is sensitive.

In a further implementation form of the first aspect, the digital signal source is configured to generate the second codeword based on a current consumption of the converter circuit when generating the output signal based on the first codeword.

In a further implementation form of the first aspect, the digital signal source is configured to generate the second codeword such that the output current of the feed forward circuit at least matches a current required by the converter circuit for generating the output signal based on the first codeword.

The above implementation forms use the knowledge of the current consumption required by the converter circuit to convert a first codeword for generating the second codeword. The second codeword is generated so as to provide an output current of the feed forward circuit that compensates, when being fed to the current supply of the converter circuit, the supply variations that would arise while converting the first codeword. This effectively reduces supply variations of the converter circuit, and leads to a significant improvement of the performance of the device.

In a further implementation form of the first aspect, the digital signal source is configured to generate the second codeword based further on a configuration of the converter circuit.

In a further implementation form of the first aspect, the configuration of the converter circuit includes a number of cells that contribute to the generation of the output signal based on the first codeword.

Converter circuits, such as DACs, typically employ a number of current switching cells to convert digital input signals to analog output signals. A current circuit in each cell is operated to provide a defined current to a current switch in the cell, and a driver circuit in each cell causes it, in response to an input digital data signal, to produce an analog output from the defined current from the current circuit. Accordingly, the above implementation forms further take into account the configuration and design of the converter circuit. This leads to an even more effective suppression of supply variations, and thus to a further improvement in the performance of the device.

In a further implementation form of the first aspect, the digital signal source is configured to generate the second codeword based additionally on an operating frequency of the converter circuit.

This allows an even more effective suppression of supply variations, and thus further improves the performance of the device.

In a further implementation form of the first aspect, the converter circuit includes a first DAC, and the output current of the feed forward circuit is provided to a current supply of the first DAC.

In a further implementation form of the first aspect, the feed forward circuit includes a second DAC.

The above implementation forms of the device accordingly use up to two DACs, and are particularly simple to realize. The supply variations of the first DAC can be completely eliminated by using the second DAC.

In a further implementation form of the first aspect, the feed forward circuit further includes a bias generation section connected to the second DAC, and the bias generation section comprises a mirroring device configured to mirror the operation of the second DAC, wherein the mirroring device includes a feedback circuit.

Thereby, the device performance can be designed to operate independently of process, voltage or temperature changes (PVT variations).

In a further implementation form of the first aspect, the device further comprises a supply unit, including a voltage regulator, configured to provide a direct current (DC) output voltage to a current supply of the converter circuit.

In a further implementation form of the first aspect, the digital signal source is configured to generate the second codeword such that the output current of the feed forward circuit together with the output current of the supply unit exceeds a current required by the converter circuit for generating the output signal based on the first codeword.

In a further implementation form of the first aspect, the digital signal source is configured to generate the second codeword to perform a pre-distortion of the output signal generated by the converter circuit.

According to the above implementation forms, overcompensation and/or pre-distortion of the converter circuit are enabled. The performance of the device can thereby be further improved—by, for example, further reducing spurs present in the device. Notably, the pre-distortion is not be limited to spurs or artefacts arising from supply variations, but can also address other spurs present in the device.

A second aspect provides a method that comprises providing, by a digital signal source, a first codeword to a converter circuit, in order to generate an output signal, providing, by the digital signal source, a second codeword to a feed forward circuit, in order to generate an output current, wherein the output current of the feed forward circuit is supplied to the converter circuit, and wherein the second codeword is generated by the digital signal source based on the first codeword to compensate variations of a supply current of the converter circuit.

In an implementation form of the second aspect, the method comprises generating the second codeword so as to reduce supply voltage variations to which the performance of the converter circuit is sensitive.

In a further implementation form of the second aspect, the method comprises generating the second codeword based on a current consumption of the converter circuit when generating the output signal based on the first codeword.

In a further implementation form of the second aspect, the method comprises generating the second codeword such that the output current of the feed forward circuit at least matches a current required by the converter circuit for generating the output signal based on the first codeword.

In a further implementation form of the second aspect, the method comprises generating the second codeword based further on a configuration of the converter circuit.

In a further implementation form of the second aspect, the configuration of the converter circuit includes a number of a plurality of cells that contribute to the generation of the output signal based on the first codeword.

In a further implementation form of the second aspect, the method comprises generating the second codeword based additionally on an operating frequency of the converter circuit.

In a further implementation form of the second aspect, the converter circuit includes a first DAC, and the output current of the feed forward circuit is provided to a current supply of the first DAC.

In a further implementation form of the first aspect, the first device includes a first DAC connected in series with at least a power amplifier, and the output current of the second device is provided to a current supply of the power amplifier.

In a further implementation form of the second aspect, the feed forward circuit includes a second DAC.

In a further implementation form of the second aspect, the feed forward circuit further includes a bias generation section connected to the second DAC, and the bias generation section comprises a mirroring device for mirroring the operation of the second DAC, wherein the mirroring device includes a feedback circuit.

The mirroring device particularly mirrors the operation of the second DAC, in order to keep constant the output current under changing operating conditions of the second DAC, such as supply voltage, temperature, and/or operating frequency.

In a further implementation form of the second aspect, the method further comprises providing a DC output voltage to a current supply of the converter circuit.

In a further implementation form of the second aspect, the digital signal source is configured to generate the second codeword such that the output current of the feed forward circuit together with the output current of the supply unit exceeds a current required by the converter circuit for generating the output signal based on the first codeword.

In a further implementation form of the second aspect, the digital signal source is configured to generate the second codeword to perform a pre-distortion of the output signal generated by the converter circuit.

The method of the second aspect and its implementation forms can achieve the same advantages and effects as described above with respect to the device of the first aspect and its implementation forms.

All devices, elements, units and means described in the present application could be implemented as software or hardware elements or as combinations thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented by respective software or hardware elements, or by combinations thereof.

BRIEF DESCRIPTION OF DRAWINGS

The above described aspects and implementation forms will be explained in the following description of specific embodiments in relation to the enclosed drawings, in which.

DETAILED DESCRIPTION OF EMBODIMENTS

Figure 1:
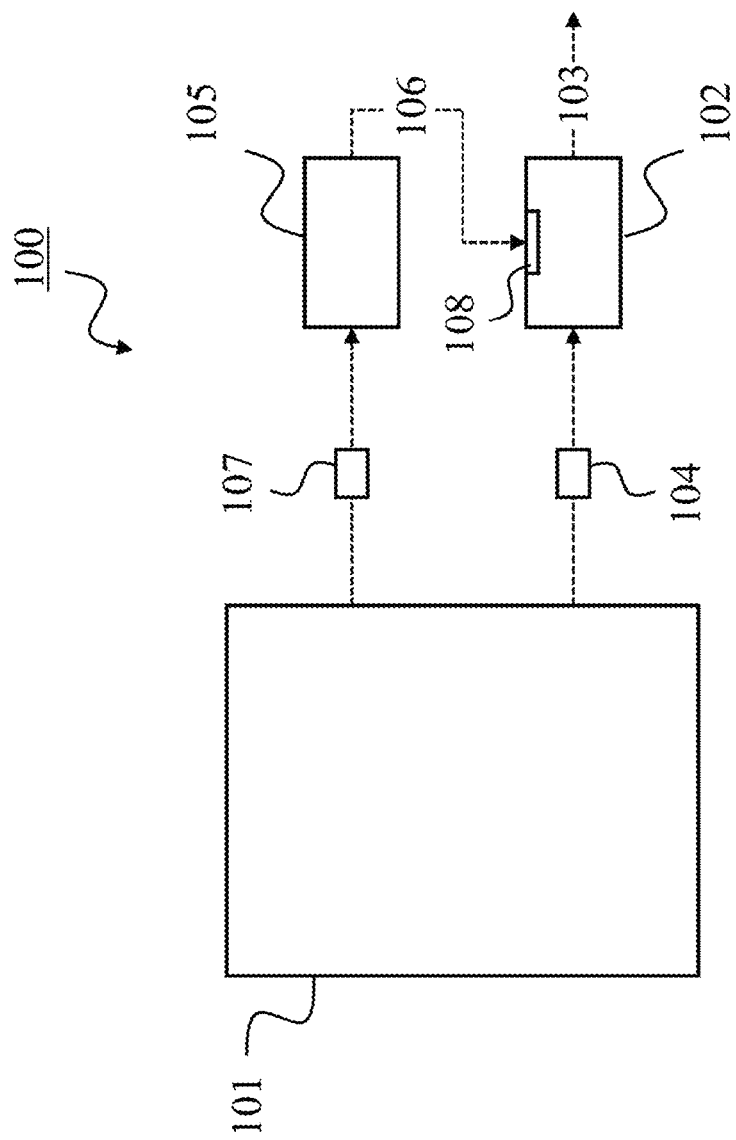
FIG. 1 shows a device according to an embodiment.

FIG. 1 shows a device 100 according to an embodiment. The device 100 is configured to process digital signals. The device 100 comprises a digital signal source 101, a converter circuit 102, and a feed forward circuit 105.

The digital signal source 101 is configured to output codewords of a digital signal, for instance, at least one first codeword 104 and at least one second codeword 107. The at least one first codeword 104 is supplied to the converter circuit 102, while the at least one second codeword 107 is supplied to the feed forward circuit 105. The digital signal source 101 may specifically be configured to supply multiple (different) first codewords 104 to the converter circuit 102 in a consecutive manner, e.g. changing codewords of a digital signal. At the same times it may supply multiple (different) second codewords 107—one for each first codeword 104—to the feed forward circuit 105.

The converter circuit 102 is configured to generate an output signal 103 based on the at least one first codeword 104 received from the digital signal source 101. Thus, it can convert a digital signal into an analog signal. The feed forward circuit 105 is configured to generate an output current 106 based on the at least one second codeword 107 received from the digital signal source 101.

This output current 106 of the feed forward circuit 105 is advantageously connected (directly or indirectly) to a current supply 108 of the converter circuit 102. Moreover, the digital signal source 101 is configured to generate the at least one second codeword 107 based on the at least one first codeword 104. Thereby, the digital signal source 101 is able to compensate variations of a supply current of the converter circuit 105.

In an implementation, the digital signal source 101 is configured to generate the at least one second codeword 107, so as to reduce supply voltage variations to which the performance of the converter circuit 105 is sensitive. Thereby, the digital signal source 101 is configured to generate the second codeword 107 based on a current consumption of the converter circuit 105 when generating the output signal 103 based on the first codeword 104. The digital signal source 101 has knowledge of this codeword-dependent current consumption of the converter circuit 102, and can select the second codeword 107 accordingly. The digital signal source 101 may generate the second codeword 107 such that the output current 103 of the feed forward circuit 105 at least matches a current required by the converter circuit 102 for generating the output signal 103 based on the first codeword 104. Notably, over-compensating of the current required by the converter circuit 102 is also possible.

In the following, the above-described concept is further illustrated for the case of a DAC, where the impact is on both the digital and analog subsystem. However, the invention is notably not limited to a DAC.

Figure 2:
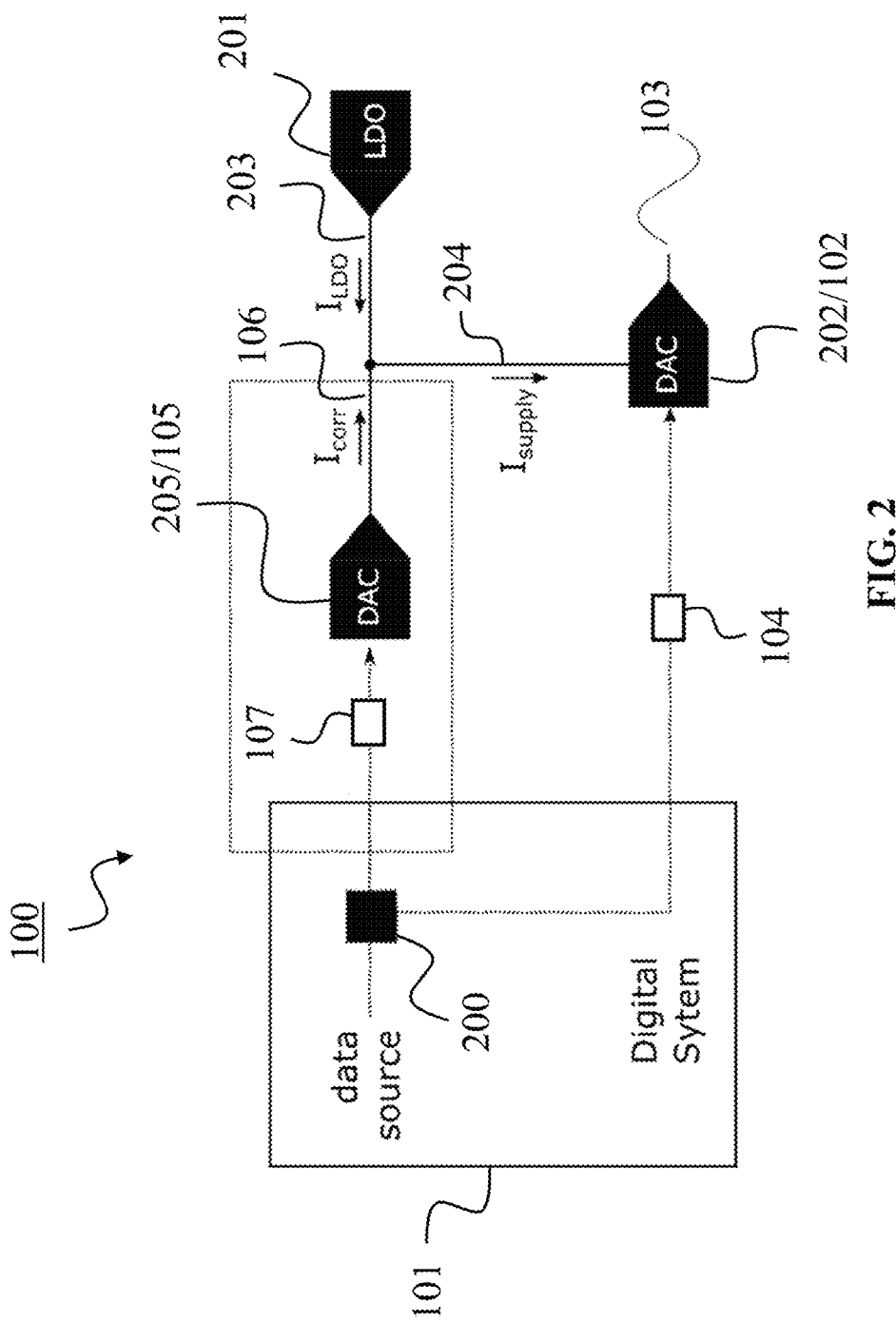
FIG. 2 shows a device according to an embodiment using two DACs.

FIG. 2 shows a device 100 according to an embodiment, which builds on the device 100 shown in FIG. 1. Same elements are labelled with same reference signs and function likewise. Accordingly, also the device 100 of FIG. 2 has the digital signal source 101 for providing the first and second codewords 104 and 107, respectively, the converter circuit 102 for outputting the output signal 103 based on the first codeword 104, and the feed forward circuit 105 for supplying the output current 106 produced based on the second codeword 107 towards the converter circuit 102.

FIG. 2 illustrates specifically a device 100, in which the converter circuit 102 is (or includes) a first DAC 202, in which the feed forward circuit 105 is (or includes) a second DAC 205, and in which the output current 106 of the feed forward circuit 105 is provided to a current supply 108 of the first DAC 202. Because the supply current $I_{supply}$ required by the first DAC 202 is (indirectly) known to the digital signal source 101, an open loop correction can be performed with the second DAC 205.

FIG. 2 shows in detail that the digital signal source 101 is a digital system including at least one data source 200. The digital signal source 101 is configured to output the first codeword 104, in order to set the output level of the first DAC 202. This causes the first DAC 202 to consume a certain amount of current related to the first codeword 104. At the same time, however, the digital signal source 101 is configured to program the second DAC 205 with a second (correction) codeword 107, thereby setting its output current 106 ($I_{corr}$). When this resulting output current 106 matches the current required by the first DAC 202, only a very small current ($I_{LDO}$) would be drawn from a supply unit 201 (e.g. an LDO). The supply unit 201 may be part of the device 100 or not. As a result, voltage variations of the supply of the first DAC 202 are very strongly suppressed—if not eliminated. The second codeword 107 can be calculated from the first codeword 104, for instance taking into account the structure of the first DAC 202 (e.g. the construction of the first DAC 202 from current switching cells with unit weight or binary scaled weights).

The above-described current injection concept can also be applied to blocks of a device 100 other than the first DAC 202, as long as the current consumption profile of the block can be predicted.

Figure 3:
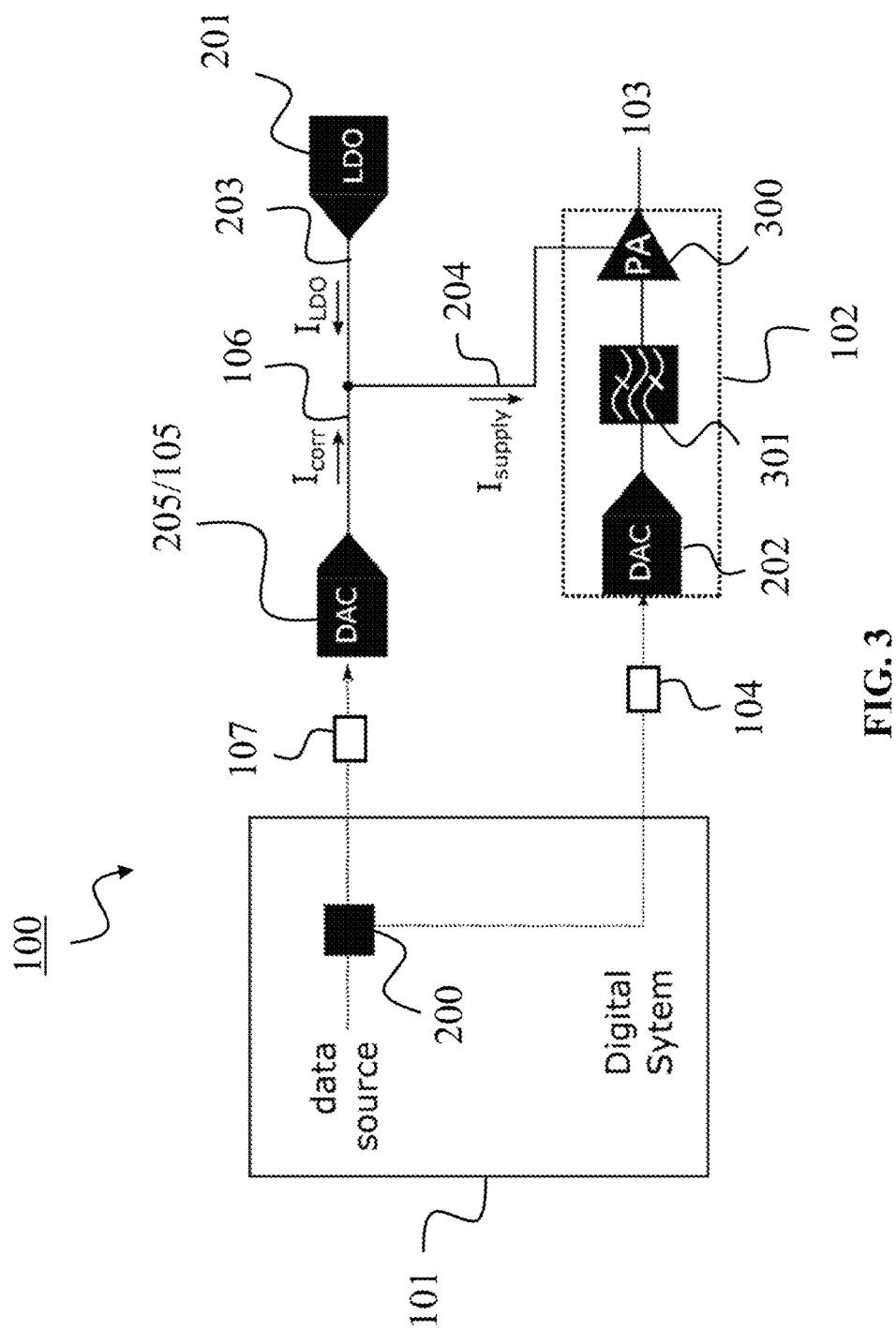
FIG. 3 shows a device according to an embodiment using two DACs.

FIG. 3 shows in this respect an exemplary device 100, which builds on the device 100 shown in FIG. 1 and has several components in common with the device 100 shown in FIG. 2. Same elements are labelled with same reference signs and function likewise. Accordingly, also the device 100 of FIG. 3 has the digital signal source 101 for providing the first and second codewords 104 and 107, the converter circuit 102 for outputting the output signal 103 based on the first codeword 104, and the feed forward circuit 105 for supplying the output current 106 based on the second codeword 107 towards the converter circuit 102.

FIG. 3 illustrates specifically a device 100, in which the converter circuit 102 includes a first DAC 202 connected in series with a power amplifier 300 (as example of another block to which the current injection concept can be applied). Further, the feed forward circuit 105 is (or includes) a second DAC 202. The output current 106 of the feed forward circuit 105, which bases on the second codeword 107, is in this device 100 provided to a current supply of the power amplifier 300 (not of the first DAC 202 as in FIG. 2). Accordingly, the current injection concept is here used to reduce a supply ripple and distortion of the power amplifier 300, because this is correlated with the first codeword 104, and the second codeword 107 is generated on the second codeword 107 to compensate variations of a supply current of the power amplifier 300 of the converter circuit 102.

The converter circuit 102 may further include a bandpass filter 300. In particular, the first DAC 202 may be followed by the bandpass filter 301 and then the power amplifier 300, i.e. the bandpass filter 301 may be connected in series between the first DAC 202 and the power amplifier 300.

FIG. 3 shows in detail that the first codeword 104 from the digital signal source 101 is converted to an analog signal by the first DAC 102 (which is e.g. directly supplied by a supply unit, which may be an LDO, without any correction). The first DAC 202 drives the power amplifier 300. The current consumption of the power amplifier 300 depends on its input signal (i.e. on the codeword-dependent output signal of the first DAC 202) and will cause distortion. If, however, the second DAC 205 is connected, as in FIG. 3, in parallel with a supply unit 201 of the power amplifier 300, a supply ripple can be reduced. To this end, the second codeword 107 is specifically generated so as to compensate variations of a supply current of the power amplifier 300, which variations are caused indirectly by the first codeword 104. That is, knowledge of a current consumption required by the power amplifier 300 specifically for amplifying the output of the DAC 102 based on the first codeword 104 is used to generate the second codeword for the second DAC 205, in order to counter a supply ripple at the power amplifier 300. Thereby, the second codeword 107 generated for the second DAC 205 can, for example, be obtained from a one-time characterization of the device 100 or can be obtained from a calibration loop. Depending on the kind of non-linearities in the power amplifier 300, it is possible that this type of correction is less computationally intensive than a conventional digital pre-distortion solution.

In the devices 100 of FIG. 2 and FIG. 3, respectively, it is also possible to overcompensate by injecting more current than required by the first DAC 202. This may further reduce harmonic distortion. In effect, by overcompensating, a pre-distorting of the first DAC 202 in the analog domain is carried out.

In an embodiment, only information regarding the current consumption of the first DAC 202 may be used when generating the second codeword 107 based on the first codeword 104, in order to compensate variations of a supply current of the second DAC 202. However, it is also possible that other information can be derived from the first codeword 104. Thus, it is also possible to reduce—in the same manner—other spurs present in the device 100 (e.g. LO leakage), using the second DAC 205.

The scale of the second DAC 205 may be programmable. This enables fine-tuning the required current of the first DAC 202 over process, voltage, temperature or other variations (PVT variations). The power consumption may also depend on the operation frequency of the first DAC 202, which can also be taken into account when changing the scale of the second DAC 205.

Figure 4:
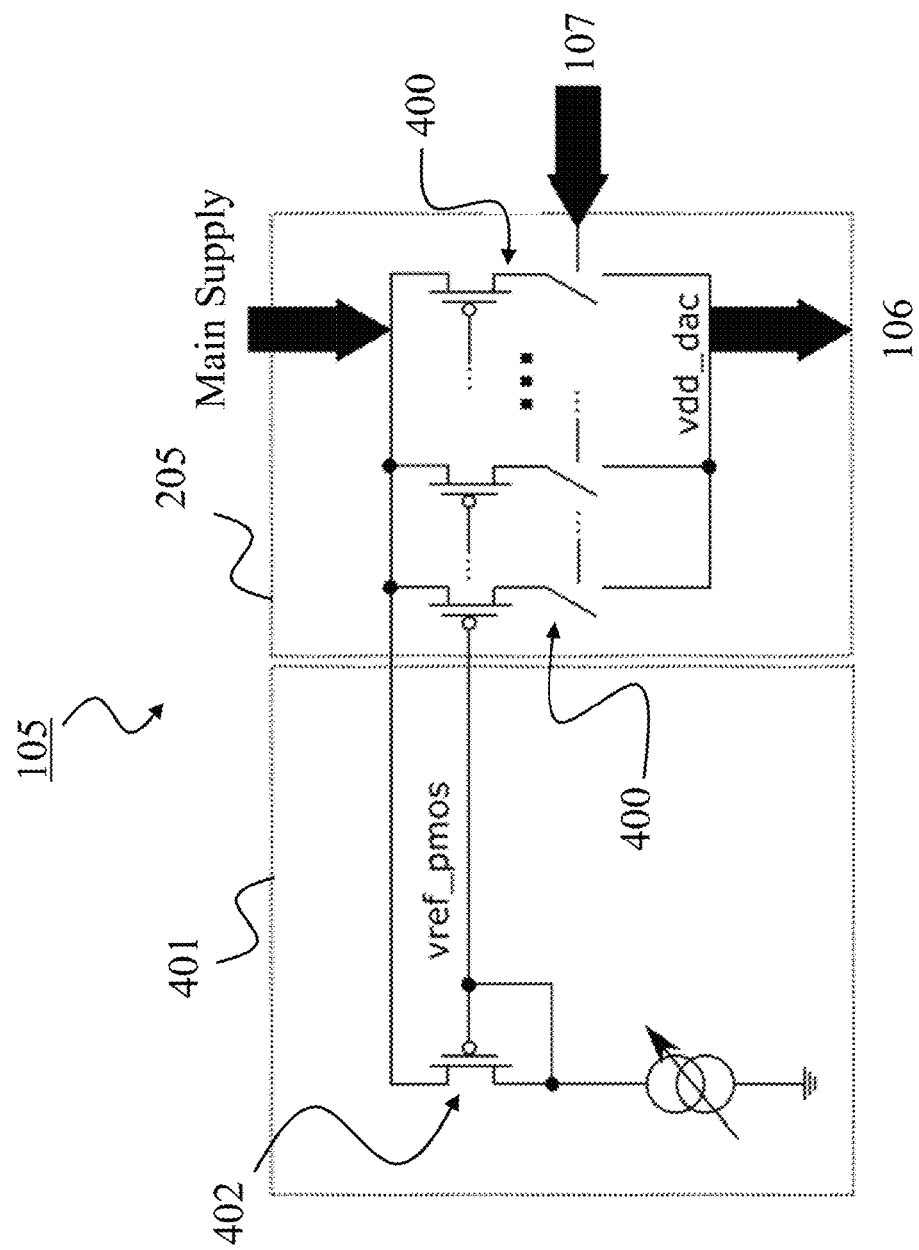
FIG. 4 shows a feed forward circuit of a device according to an embodiment including a DAC and a bias generation section for biasing the DAC.

FIG. 4 shows an exemplary implementation of a feed forward circuit 105 for a device 100 according to an embodiment, e.g. a device 100 as shown in the FIGS. 1-3. This feed forward circuit 105 is specifically implemented for the case of a 10-bit radio frequency DAC (RFDAC) as the first DAC 202. The RFDAC consisted of 64 cells, which are used in pairs of two. Thus, a 5-bit second DAC 205 may be used in the feed forward circuit 105. The current switching cells 400 of this second DAC 205 may include p-type metal oxide semiconductor (PMOS) devices, and are for switching a main supply current to an output (correction) current 106 provided towards the first DAC 202. FIG. 4 shows specifically that the second DAC 205 is implemented as a current DAC and is biased from a bias generation section 401 using a diode connected PMOS device 402.

While the feed forward circuit 105 of FIG. 4 allows compensating codeword-dependent supply variations of the first DAC 202, and thus improving the performance of the device 100, it is not yet optimized for PVT variations. In particular, in this exemplary implementation the drain voltage of the second DAC 205 ("vdd_dac") can vary from the drain voltage of the diode device 402 in the bias generation section 401. Because of this, the amount of injected current could potentially vary over PVT variations. This would entail that during operation of the device 100, one would need to adjust the bias point. And such adjustments would require inputs such as operating voltages, temperature, etc.

The settings of the second DAC 205 can be made independent of PVT variations as presented in the following. The presented solution notably could presents also a strong improvement on other bias strategies. In particular, the feed forward circuit 105 may include a mirroring device 501 its bias generation section 401 connected to the second DAC 205—as shown in FIG. 5.

FIG. 5 shows again a feed forward circuit 105 of a device 100 according to an embodiment, e.g. a device 100 as shown in the FIGS. 1-3. The exemplary feed forward circuit 105 particularly builds on the one shown in FIG. 4.

Figure 5:
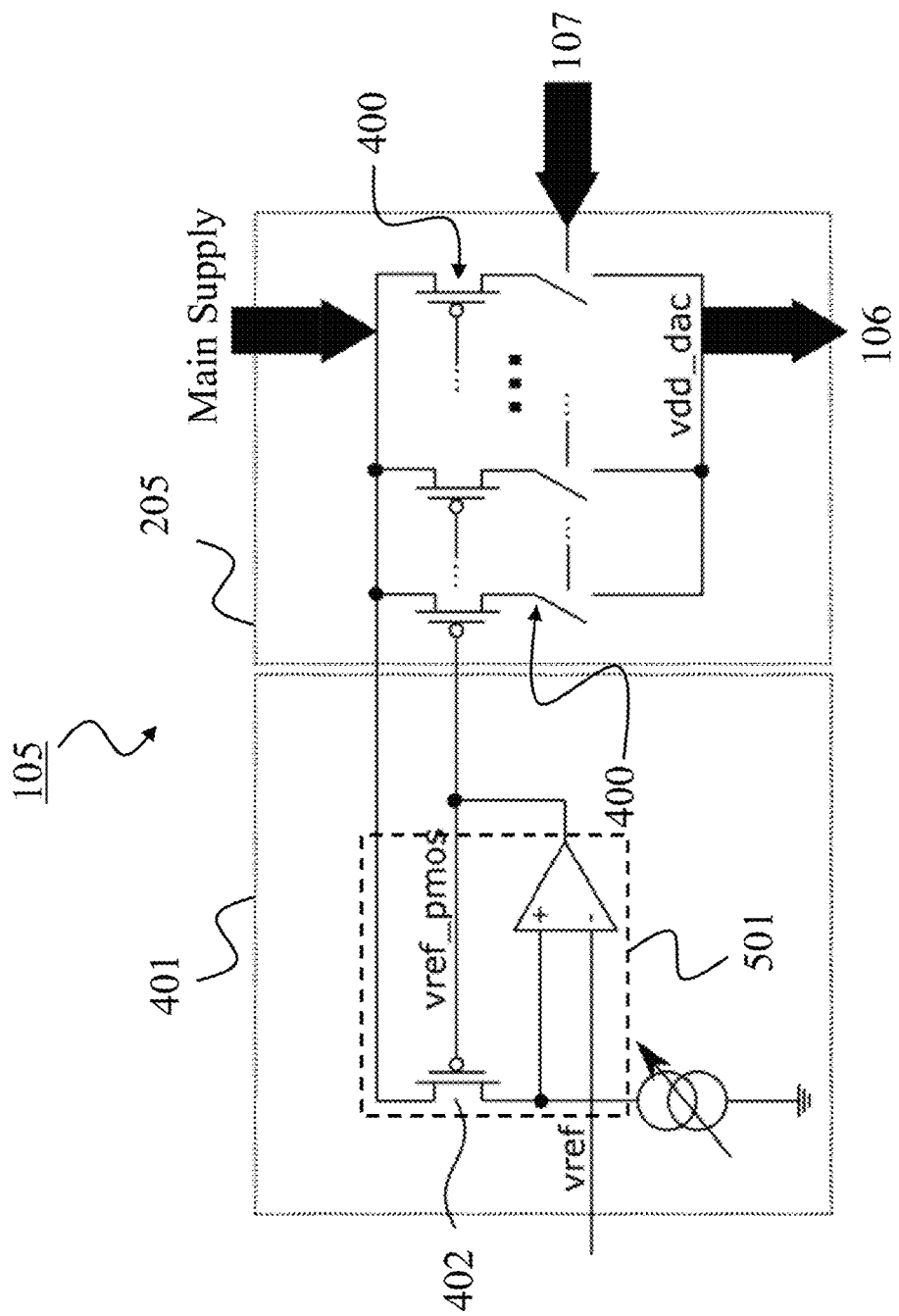
FIG. 5 shows a feed forward circuit of a device according to an embodiment including a DAC and a bias generation section for biasing the DAC.

FIG. 5 shows specifically that the mirroring device 501 includes the diode device 402 and a feedback circuit. When the reference voltage "vref" tracks the DAC supply voltage "vdd_dac", a bias feedback loop can make the current per cell 400 of the second DAC 205 independent of PVT variations. This is because the reference PMOS device is then operating under identical conditions as the second DAC cells 400. The output current 106 is then also independent of the operating region of the feed forward circuit 105. Key is that the mirroring device 501 operates under identical conditions as the cells 400 of the secondary DAC 205. The mirroring device 501 is exemplarily implemented using a feedback circuit, but there are other ways of accomplishing it. For example, by making use of a cascode transistor.

An alternative to the bias feedback loop could be a voltage DAC to set in FIG. 4 the "vref_pmos" voltage. However, this would suffer from the drawback that this reference voltage needs to be adjusted over VT corners, i.e. during operation of the device 100.

Figure 6:
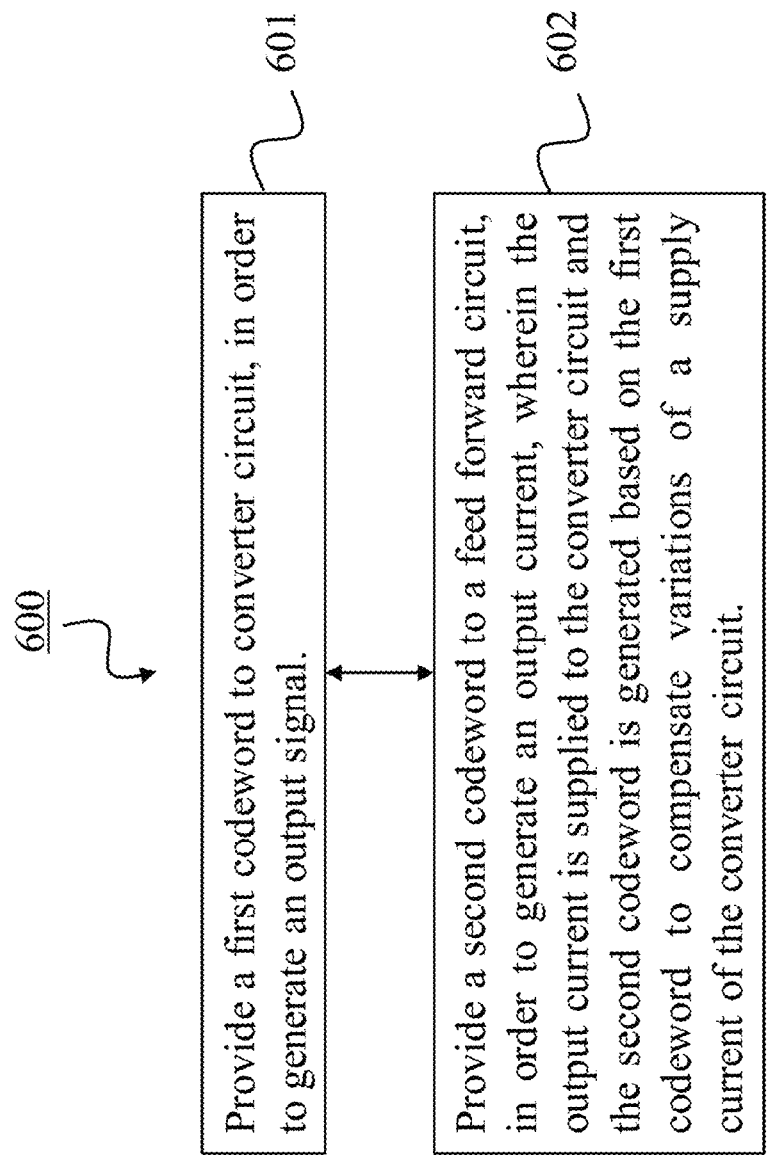
FIG. 6 shows a method according to an embodiment.

FIG. 6 shows a method according to an embodiment. The method 600 can be carried out for processing digital signals. For instance, the method 100 may be performed by a device 100 according to an embodiment as shown FIGS. 1-5.

The method 600 includes a step 601 of providing, by a digital signal source 101, a first codeword 104 to a converter circuit 102, in order to generate an output signal 103. Further, the method 600 comprises a step 602 of providing, by the digital signal source 101, a second codeword 107 to a feed forward circuit 105, in order to generate an output current 106. The output current 106 of the feed forward circuit 105 is supplied to the converter circuit 102. Further, the second codeword 107 is generated by the digital signal source 101 based on the first codeword 104, particularly such that variations of a supply current of the converter circuit 102 are compensated.

Figure 7:
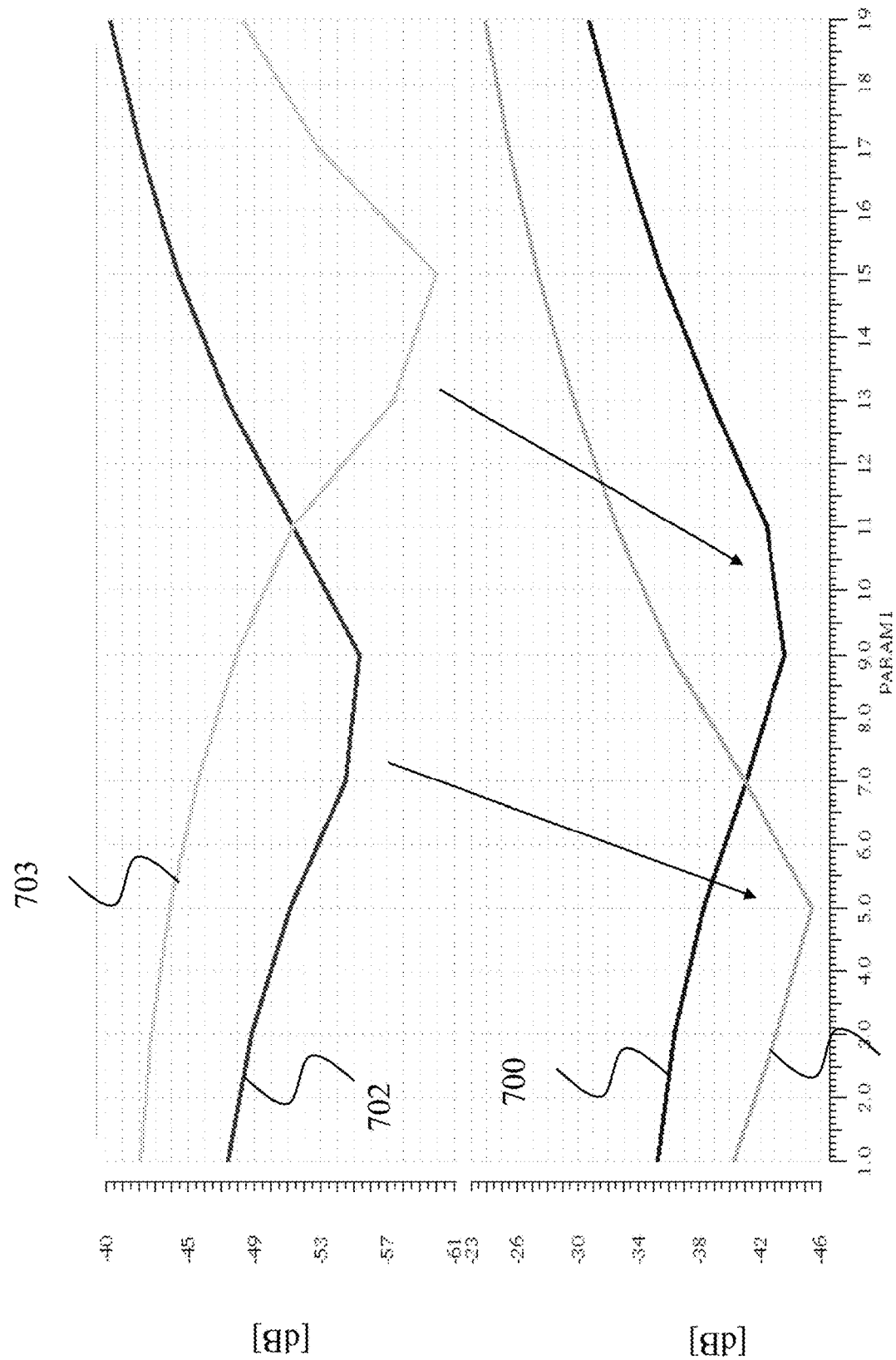
FIG. 7 shows results of simulating the harmonic distortion of the converter circuit of a device according to an embodiment.

FIG. 7 shows simulations performed on the dynamic performance of the first DAC 202 of a device 100 according to an embodiment, while changing the scale (x-axis) of the second DAC 205. In particular, in the top graph results 702 and 703 on the harmonic distortion (in dB) of the first DAC 202 are shown. The simulation result 702 is obtained at a different operating frequency than the simulation result 703. The bottom graph shows results 700 and 701 of the corresponding supply variation of the first DAC 202 (in dB). Again, the result 700 is obtained at a different operating frequency than the result 701. The arrows between the top and bottom graph show that the result 702 corresponds to the result 701, and the result 703 corresponds to the result 700.

In particular, the largest (frequency-dependent) non-linearity/harmonic distortion (top graph) and the largest supply ripple/variation (bottom graph) are illustrated in FIG. 7 as a function of the scale of the second DAC 205. It can be seen that the scale at which the supply ripple is minimal does not correspond to the scale of lowest harmonic distortion. This entails doing even better than simply reducing a supply ripple, but also performing an analog pre-distortion. At the same time, the input codeword 107 applied to the second DAC 205 is directly proportional to the input codeword 104 of the first DAC 202, leading to very little overhead in the digital data source 101 (as opposed to digital pre-distortion).

The present invention has been described in conjunction with various embodiments as examples as well as implementations. However, other variations can be understood and effected by those persons skilled in the art and practicing the claimed invention, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. A device for processing digital signals, the device comprising:
    a digital signal source configured to output a digital signal, the digital signal comprising a sequence of codewords;
    a feed forward circuit connected to the digital signal source and configured to generate, for each respective codeword in the sequence of codewords, a respective output current corresponding to the respective codeword; and
    a converter circuit comprising a current supply, the converter circuit being configured to convert the digital signal into an analog output signal by, for each respective codeword in the sequence of codewords:
        receiving the respective codeword from the digital signal source,
        receiving, at the current supply, the respective output current corresponding to the respective codeword, and generating respective output based on the respective codeword;
wherein each respective output current is generated based on a codeword-dependent current consumption of the converter circuit.

2. The device according to claim 1, wherein the codeword-dependent current consumption of the converter circuit specifies a required current draw that the converter circuit must consume to generate the respective output based on the respective codeword.

3. The device according to claim 2, wherein the feed forward circuit is configured to generate the respective output current corresponding to the respective codeword such that the respective output current meets or exceeds the required current draw.

4. The device according to claim 1, wherein the converter circuit includes a digital-to-analog converter (DAC), and wherein a current supply of the DAC is the current supply of the converter circuit.

5. The device according to claim 4, wherein the feed forward circuit includes a second DAC.

6. The device according to claim 5, wherein the feed forward circuit further includes a bias generation section connected to the second DAC,
wherein the bias generation section comprises a mirroring device configured to mirror an operation of the second DAC, and
wherein the mirroring device includes a feedback circuit.

7. The device according to claim 1, wherein the sequence of codewords is a sequence of first codewords, wherein the digital signal source is further configured to output a sequence of second codewords, each respective second codeword corresponding to a respective first codeword of the sequence of first codewords, and wherein the feed forward circuit is configured to receive the sequence of second codewords from the digital signal source and generate, for each respective first codeword in the sequence of first codewords, the respective output current corresponding to the respective first codeword based on the respective second codeword.

8. The device according to claim 1, further comprising a power supply configured to provide a DC output voltage to the current supply of the converter circuit.

9. The device according to claim 8, wherein a sum of a current, corresponding to the DC output voltage, received at the current supply of the converter circuit and the respective output current corresponding to the respective codeword exceeds a required current draw that the converter circuit must consume to generate the respective output based on the respective codeword, the required current draw being specified by the codeword-dependent current consumption of the converter circuit.

10. The device according to claim 9, configured to perform a pre-distortion of the analog output signal generated by the converter circuit.

11. The device according to claim 8, wherein the power supply includes a voltage regulator.

12. A method for processing digital signals, the method comprising:
providing, by a digital signal source to a converter circuit, a digital signal comprising a sequence of codewords,
generating, for each respective codeword in the sequence of codewords and by a feed forward circuit connected to the digital signal source, a respective output current corresponding to the respective codeword,
converting, by the converter circuit, the digital signal into an analog output signal by, for each respective codeword in the sequence of codewords:
receiving the respective codeword and, at a current supply of the converter circuit, the respective output current corresponding to the respective codeword, and
generating respective output based on the respective codeword,
wherein each respective output current is generated based on a codeword-dependent current consumption of the converter circuit.

13. The method according to claim 12, wherein the codeword-dependent current consumption of the converter circuit specifies a required current draw that the converter circuit must consume to generate the respective output based on the respective codeword.

14. A device for processing digital signals, comprising:
a digital signal source configured to output a codeword;
a feed forward circuit connected to the digital signal source and configured to generate a current in accordance with a required current draw; and
a converter circuit having a current supply, the converter circuit being configured to:
receive the codeword from the digital signal source,
receive the current at the current supply, and
generate an output signal based on the codeword; and
a power supply configured to provide a DC output voltage to the current supply of the converter circuit,
wherein the device is configured to generate the current based on the codeword.

15. The digital-to-analog conversion circuit of claim 14, wherein the DAC is configured to provide the second portion of the supply current based on a codeword.

16. The digital-to-analog conversion circuit of claim 15, wherein the codeword is associated with a codeword of the digital signal.

17. The digital-to-analog conversion circuit of claim 14, wherein the DAC comprises a plurality of current switching cells connected in parallel.

18. The digital-to-analog conversion circuit of claim 14, wherein the power supply is a low-dropout (LDO) regulator.

19. The digital-to-analog conversion circuit of claim 14, wherein the DAC is a second DAC and the converter circuit comprises a first DAC, and
wherein the first DAC is configured to receive the supply current and to convert the digital signal into an analog signal.

20. The digital-to-analog conversion circuit of claim 14, wherein the DAC is a second DAC, and
wherein the converter circuit comprises:
a first DAC configured to convert the digital signal into an analog signal, and
a power amplifier (PA) configured to receive the supply current and to amplify the analog signal.

21. The digital-to-analog conversion circuit of claim 20, wherein the converter circuit further comprises a bandpass filter, wherein the first DAC, the bandpass filter, and the power amplifier are connected in series, the first DAC preceding the bandpass filter and the bandpass filter preceding the power amplifier.

* * * * *

UNITED STATES PATENT AND TRADEMARK OFFICE
CERTIFICATE OF CORRECTION

PATENT NO. : 11,632,124 B2
APPLICATION NO. : 17/531457
DATED : April 18, 2023
INVENTOR(S) : Helsen et al.

Page 1 of 1

It is certified that error appears in the above-identified patent and that said Letters Patent is hereby corrected as shown below:

In the Claims

Claim 7: Column 11, Line 37: "second codewords from the digital signal source and gen-" should read -- second codewords from the digital signal source and to gen- --.

Signed and Sealed this
Fifteenth Day of August, 2023

Katherine Kelly Vidal
*Director of the United States Patent and Trademark Office*